(12) United States Patent
Chen et al.

(10) Patent No.: US 6,992,929 B2
(45) Date of Patent: *Jan. 31, 2006

(54) SELF-ALIGNED SPLIT-GATE NAND FLASH MEMORY AND FABRICATION PROCESS

(75) Inventors: Chiou-Feng Chen, Santa Clara, CA (US); Caleb Yu-Sheng Cho, Hsinchu (TW); Ming-Jer Chen, Hsinchu (TW); Der-Tsyr Fan, Hsinchu (TW); Prateep Tuntasood, Santa Clara, CA (US)

(73) Assignee: Actrans System Incorporation, USA, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/803,183

(22) Filed: Mar. 17, 2004

(65) Prior Publication Data

US 2005/0207225 A1 Sep. 22, 2005

(51) Int. Cl.
*G11C 16/04* (2006.01)
(52) U.S. Cl. .................... 365/185.17; 365/185.29; 257/314
(58) Field of Classification Search .......... 365/185.17, 365/185.29, 185.33; 257/314, 315, 316, 257/317
See application file for complete search history.

(56) References Cited

U.S. PATENT DOCUMENTS

| | | | |
|---|---|---|---|
| 4,959,812 A | 9/1990 | Momodomi et al. | |
| 5,050,125 A | 9/1991 | Momodomi et al. | |
| 6,486,509 B1 * | 11/2002 | Van Houdt | 257/319 |
| 6,818,512 B1 * | 11/2004 | Hsieh | 438/267 |
| 6,861,700 B2 * | 3/2005 | Guterman et al. | 257/321 |

* cited by examiner

Primary Examiner—Richard Elms
Assistant Examiner—Hien Nguyen
(74) Attorney, Agent, or Firm—Edward S. Wright

(57) ABSTRACT

Self-aligned split-gate NAND flash memory cell array and process of fabrication in which rows of self-aligned split-gate cells are formed between a bit line diffusion and a common source diffusion in the active area of a substrate. Each cell has control and floating gates which are stacked and self-aligned with each other, and erase and select gates which are split from and self-aligned with the stacked gates, with select gates at both ends of each row which partially overlap the bit line the source diffusions. The channel regions beneath the erase gates are heavily doped to reduce the resistance of the channel between the bit line and source diffusions, and the floating gates are surrounded by the other gates in a manner which provides significantly enhanced high voltage coupling to the floating gates from the other gates. The memory cells are substantially smaller than prior art cells, and the array is biased so that all of the memory cells in it can be erased simultaneously, while programming is bit selectable.

30 Claims, 16 Drawing Sheets

US 6,992,929 B2

SELF-ALIGNED SPLIT-GATE NAND FLASH MEMORY AND FABRICATION PROCESS

BACKGROUND OF THE INVENTION

1. Field of Invention

This invention pertains generally to semiconductor memory devices and, more particularly, to a self-aligned split-gate NAND flash memory and process of fabricating the same.

2. Related Art

Nonvolatile memory is currently available in several forms, including electrically programmable read only memory (EPROM), electrically erasable programmable read only memory (EEPROM), and flash EEPROM. Flash memory has been widely used for high volume data storage in devices such as memory cards, personal digital assistants (PDA's), cellular phones, and MP3 players. Such applications require high density memory, with smaller cell size and reduced cost of manufacture.

NOR-type stack-gate flash memory cells typically have a bit line contact, a source region, a floating gate, and a control gate, with the control gate being positioned directly above the floating gate. The relatively size of such cells prevents them from being used in very high density data storage applications.

Cell size is smaller in a NAND flash memory array having a series of stack-gate flash memory cells connected in series between a bit-line and a source line, with only one bit-line contact. Such an array is illustrated in FIG. 1 and described in greater detail in U.S. Pat. Nos. 4,959,812 and 5,050,125. In this array, stack-gate memory cells 21 are connected in series between a bit line 22 and a source line 23. The cells are formed in a P-well 24 in a substrate 26 of either N- or P-type silicon. Each of the cells has a floating gate 27 fabricated of a conductive material such as polysilicon and a control gate 28 fabricated of a conductive material such as polysilicon or polycide. The control gate is positioned above and in vertical alignment with the floating gate.

Two select gates 29, 31 are included in the array, one near the bit line contact 32 and one near source diffusion 23. Diffusions 33 are formed in the substrate between the stacked gates and between the stacked gates and the select gates to serve as source and drain regions for the transistors in the memory cells. Bit line diffusion 22, source diffusion 23, and diffusions 33 are doped with N-type dopants.

To erase the memory cell, a positive voltage of about 20 volts is applied between the P-well and the control gates, which causes the electrons to tunnel from the floating gates to the channel regions beneath them. The floating gates thus become positively charged, and the threshold voltage of the stack-gate cells becomes negative.

To program the memory cells, the control gates are biased to a level of about 20 volts positive relative to the P-well. As electrons tunnel from the channel region to the floating gates, the floating gates are negatively charged, and the threshold voltage of the stack-gate cells becomes positive. By changing the threshold voltage of a stack-gate cell, the channel beneath it can be in either a non-conduction state (logical "0") or a conduction state (logical "1") when a zero voltage is applied to the control gate during a read operation.

However, as fabrication processes advance toward smaller geometries, e.g. tens of nanometers, it is difficult to form a high-voltage coupling ratio which is sufficient for program and erase operations while maintaining a small cell size and meeting stringent reliability requirements such as 10-year data retention and 1,000,000 cycling operations between failures.

OBJECTS AND SUMMARY OF THE INVENTION

It is in general an object of the invention to provide a new and improved semiconductor device and process for fabricating the same.

Another object of the invention is to provide a semiconductor device and process of the above character which overcome the limitations and disadvantages of the prior art.

These and other objects are achieved in accordance with the invention by providing a self-aligned split-gate NAND flash memory cell array and process of fabrication in which rows of self-aligned split-gate cells are formed between a bit line diffusion and a common source diffusion in the active area of a substrate. Each cell has control and floating gates which are stacked and self-aligned with each other, and erase and select gates which are split from and self-aligned with the stacked gates, with select gates at both ends of each row which partially overlap the bit line the source diffusions. The channel regions beneath the erase gates are heavily doped to reduce the resistance of the channel between the bit line and source diffusions, and the floating gates are surrounded by the other gates in a manner which provides significantly enhanced high voltage coupling to the floating gates from the other gates. The array is biased so that all of the memory cells in it can be erased simultaneously, while programming is bit selectable.

DETAILED DESCRIPTION

Figure 1:
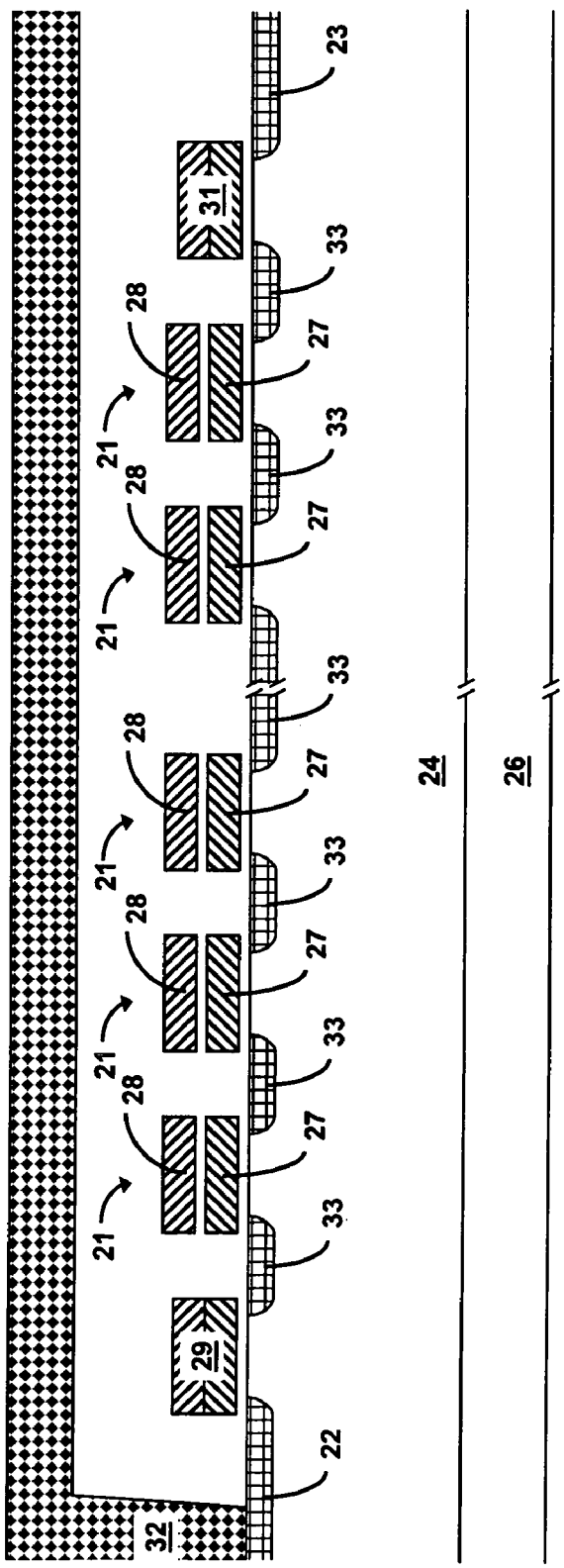
FIG. 1 is a cross-sectional view of a NAND flash memory array with a series of stack-gate flash memory cells of the prior art.
Figure 2:
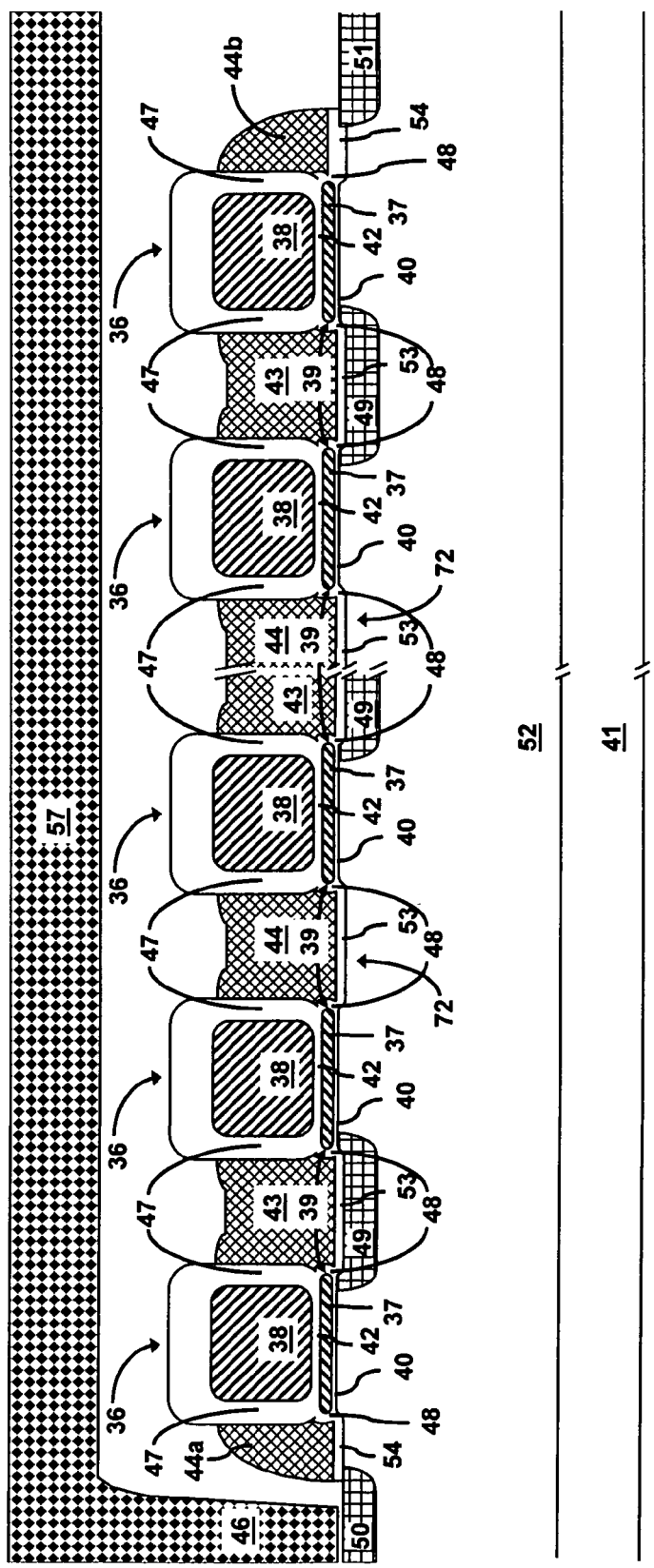
FIG. 2 is a cross-sectional view, taken along line 2—2 in FIG. 3, of one embodiment of a self-aligned split-gate NAND flash memory cell array incorporating the invention.
Figure 3:
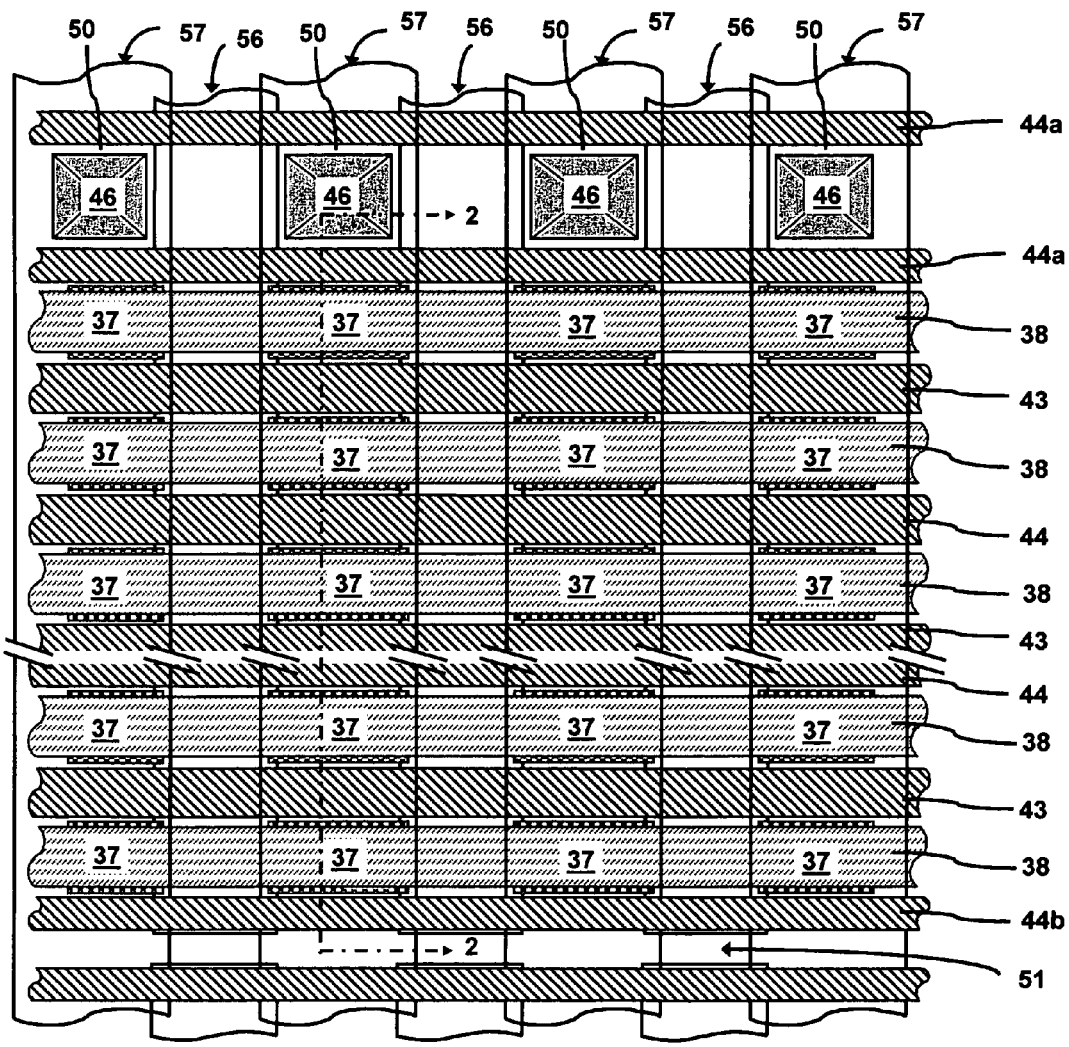
FIG. 3 is a top plan view of the embodiment of FIG. 2.

As illustrated in FIGS. 2 and 3, the memory includes an array of split-gate NAND flash memory cells 36, each of which has a floating gate 37 and a control gate 38, with the control gate being positioned above and in vertical alignment with the floating gate.

The floating gates are relatively thin and are fabricated of a conductive material such as polysilicon or amorphous silicon, with a preferred thickness on the order of 100 Å to 1000 Å. Thin gate insulators 40, typically a thermal oxide, are positioned between the floating gates and the underlying the substrate.

The control gates are narrower in horizontal dimension and thicker in vertical dimension than the floating gates, with the edge portions of the floating gates extending laterally beyond the edge portions of the control gates. The control gates are fabricated of a conductive material such as a doped polysilicon or polycide, and each of the control gates is insulated from the floating gate beneath it by a dielectric film 42. That film can be either a pure oxide or a combination of oxide, nitride and oxide (ONO), and in the presently preferred embodiment, it consists of a layer nitride between two layers of oxide.

Erase gates 43 and select gates 44 are disposed alternately between stack-gate cells 36, and additional select gates 44a, 44b are adjacent to the cells at the ends of the group. These gates are fabricated of a conductive material such as a doped polysilicon or polycide, and are self-aligned with and parallel to the adjacent control gates and floating gates, with thick dielectric films 47 separating them from the adjacent control gates and thin tunnel oxides 48 separating them from the floating gates. Both the dielectric films and the tunnel oxides can be either a pure thermal oxide or a combination of thermal oxide, a CVD oxide and a CVD nitride.

Diffusion regions 49, a bit line diffusion 50, and a common source diffusion 51 are formed in a P-type well 52 in the upper portion of substrate 41 and doped with an N-type material. Diffusion regions 49 are positioned directly beneath the erase gates 43, and bit line diffusion 50 is partially overlapped by the select gate 44a at one end of the array. Common source diffusion region 51 is partially overlapped by the select gate 44b at the other end of the array and is shared by this array of cells and by another array (not shown) of the same type.

Erase gates 43 and select gates 44 are separated from the diffusion regions and the substrate by gate oxides 53, and select gates 44a, 44b are separated from the substrate by gate oxides 54. Oxide layers 53 and 54 can be either a pure thermal oxide or a combination of thermal oxide and CVD oxide.

In this embodiment, erase paths are formed between the side walls 39 of the floating gates and the adjacent erase gates 43 and select gates 44, 44a, 44b, through tunnel oxides 48.

As illustrated in FIG. 3, isolation regions 56 are formed between rows of cells, and control gates 38 cross over floating gates 37 and the isolation regions. Erase gates 43 and select gates 44, 44a, 44b are parallel to the control gates. Bit lines 57 are perpendicular to those gates, and cross over the bit line contact, gates in the respective rows, and the common source region.

The N+ diffusions 49 beneath the erase gates significantly reduce the resistance of the channel region between bit line diffusion 50 and common source diffusion 51. As a result, bit line and common source voltages can pass to selected cells with substantially less voltage drop along the channel. This permits the length of the structure and the number of cells in each row to be substantially greater than in devices without the N+ diffusions, e.g. 32 cells vs. 16.

The memory cell array of FIGS. 2 and 3 can be fabricated by the process illustrated in FIGS. 4A through 4H. In this process, an oxide layer 58 is thermally grown to a thickness of about 70 Å to 150 Å on a monocrystalline silicon substrate which is illustrated as comprising a P-type substrate 41 in which a P-type well 52 is formed. Alternatively, if desired, an N-type well can be formed in the P-type substrate, in which case the P-type well is formed in the N-type well.

A conductive layer 59 of polysilicon or amorphous silicon (poly-1) is deposited on the thermal oxide to a thickness on the order of 100 Å to 1000 Å, and a dielectric layer 61 (the inter-poly dielectric) is formed on the silicon. This silicon is preferably doped with phosphorus, arsenic or boron to a level on the order of $10^{17}$ to $10^{20}$ per cm$^3$ and is subsequently etched to form floating gates 37. The doping can be done in-situ during deposition of the silicon or by ion implantation directly into the silicon or through the dielectric 61 above it.

The inter-poly dielectric can be either a pure oxide or a combination of oxide, nitride and oxide (ONO), and in the embodiment illustrated, it consists of a lower oxide layer having a thickness on the order of 30–100 Å, a central nitride layer having a thickness on the order of 60–300 Å, and an upper oxide layer having a thickness on the order of 30–100 Å.

A second layer of polysilicon 62 (poly-2) is deposited on dielectric film 61, and is subsequently etched to form the control gates 38. This layer has a thickness on the order of 1500 Å–3500 Å, and is doped with phosphorus, arsenic or boron to a level on the order of $10^{20}$ to $10^{21}$ per cm$^3$.

A CVD oxide or nitride layer 63 having a thickness on the order of 300 Å–1000 Å is deposited on the poly-2 layer, and is used as a mask to prevent the poly-2 material from etching away during subsequent dry etching steps.

Figure 4A:
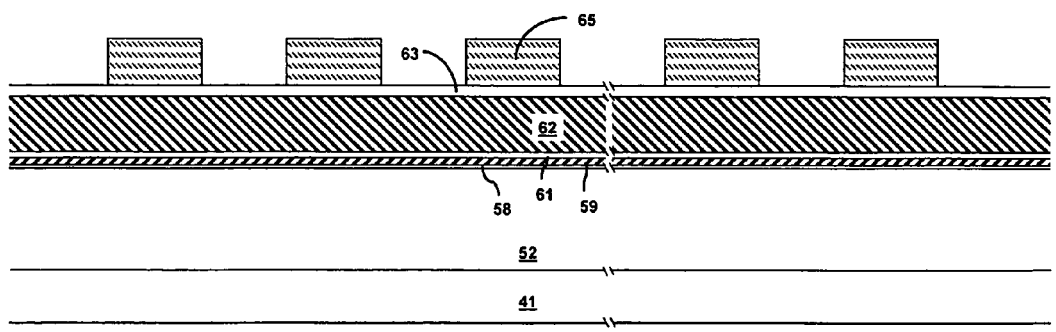
FIGS. 4A–4H are schematic cross-sectional views illustrating the steps in the embodiment of a process for fabricating a NAND flash memory cell array in accordance with the invention.
Figure 4B:
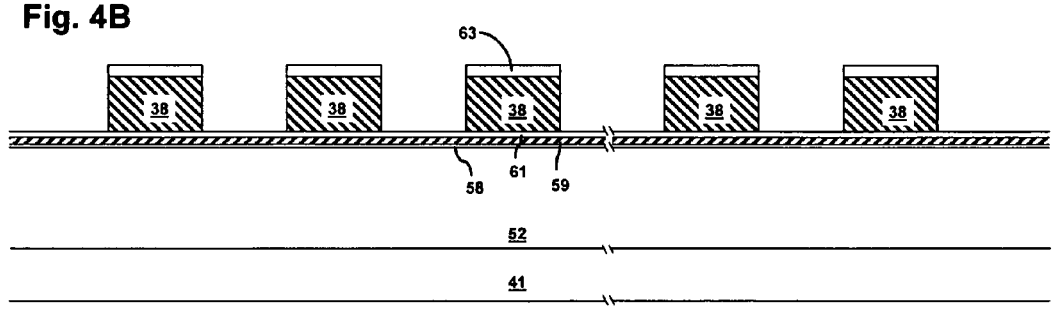

A photolithographic mask 65 is formed over layer 63 to define the control gates, and the unmasked portions of that layer and the poly-2 layer are etched away anisotropically, leaving only the portions of the poly-2 which form the control gates 38, as illustrated in FIG. 4B.

Figure 4C:
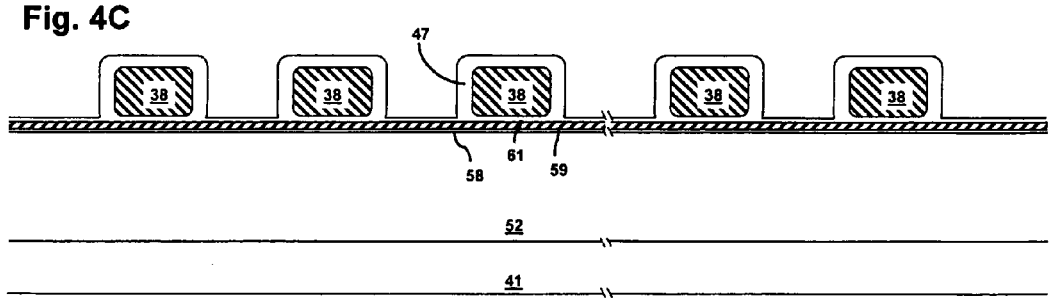

The photoresist is then stripped away, and oxide 47 is thermally grown on the side walls of the control gates to a thickness on the order of 200 Å–700 Å, as shown in FIG. 4C.

Using oxide 47 as a mask, the exposed portions of the inter-poly dielectric 61 and the underlying portions of the poly-1 layer 59 are etched away anisotropically to form floating gates 37, with only a thin layer of oxide 58 being left on the surface of the substrate between the gates.

Figure 4D:
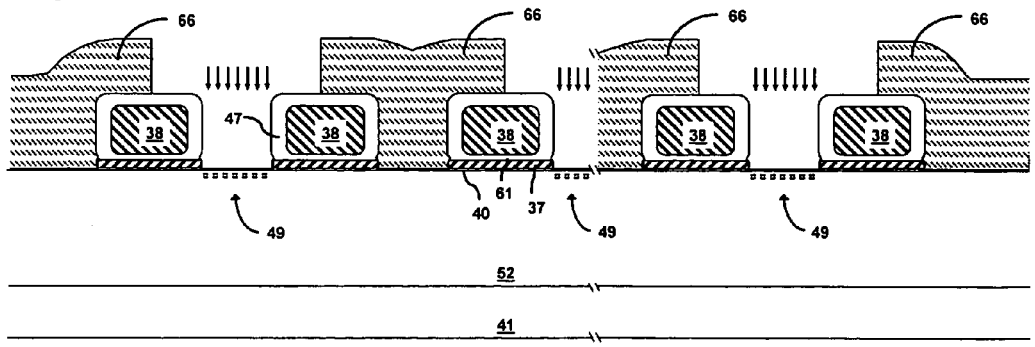

A photolithographic mask 66 is formed to define diffusion regions 49 between every other pair of stack-gate memory cells 36, as illustrated in FIG. 4D. Diffusion regions 49 are then formed in the substrate between those gates by ion implantation, using dopants such as $P^{31}$ or $As^{75}$.

Figure 4E:
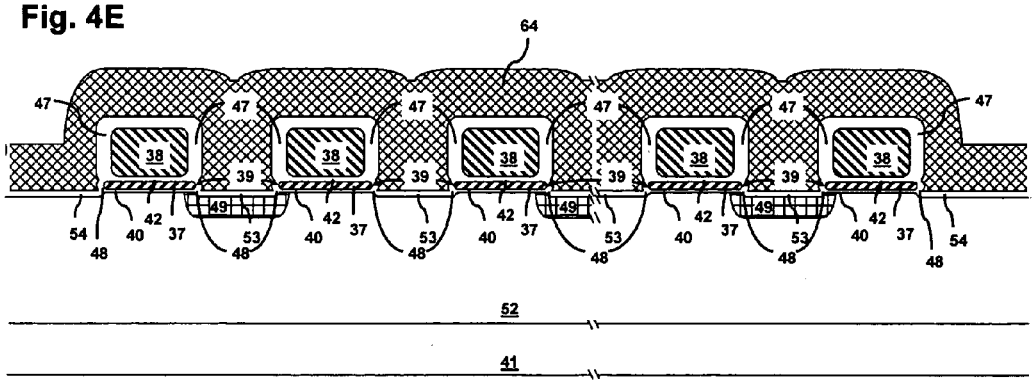

Following ion implantation, the photoresist is stripped away, and another thermal oxidation is performed, which builds up tunnel oxide 48, thermal oxide 53, and gate oxide 54, as shown in FIG. 4E. Tunnel oxide 48 is thus built up to a thickness on the order of 100 Å–250 Å, and Gate oxide 54 is built up to a thickness on the order of 100 Å–300 Å.

To improve the quality of the oxide films and reduce disturbances between the floating gates and the select and erase gates, a thin CVD oxide of about 50 Å–200 Å can be deposited before or after thermal oxidation.

As a result of these processing steps, each of the control gates is self-aligned to the floating gate beneath it, the control gate is narrower than the floating gate, and the edge portions of the floating gate extend laterally beyond the edge portions of the control gate.

Following thermal oxidation, a conductive layer (poly-3) 64 is deposited over the entire wafer, as illustrated in FIG.

4E. This layer is typically doped polysilicon or polycide, and it is deposited to a thickness on the order of 1500 Å–4000 Å.

Figure 4F:
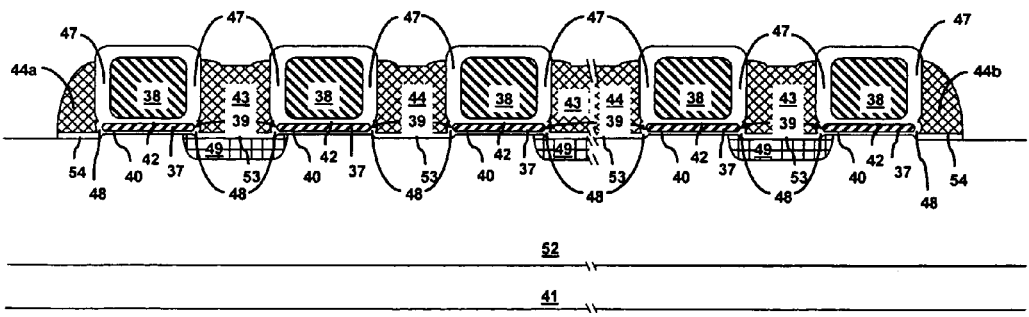

The poly-3 layer is then etched anisotropically, leaving only the portions which form erase gates 43 and select gates 44a, 44b, 44, as illustrated in FIG. 4F. Being formed in this manner, the erase gates and the select gates are self-aligned with and parallel to the control gates.

Figure 4G:
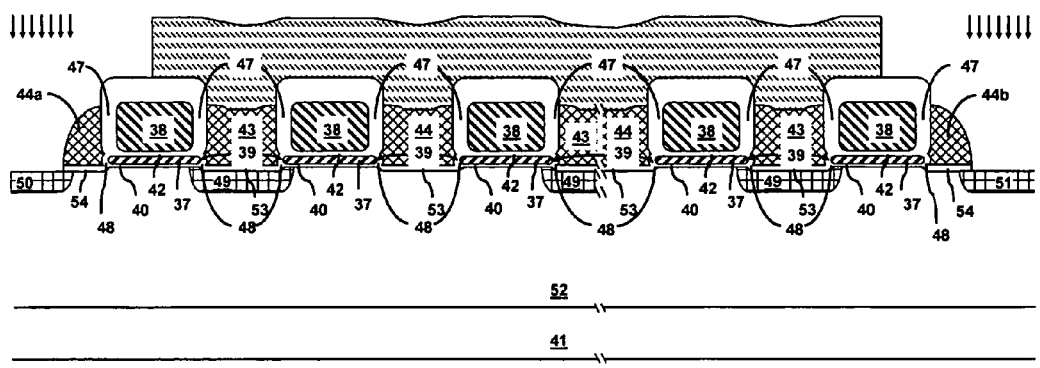
Figure 4H:
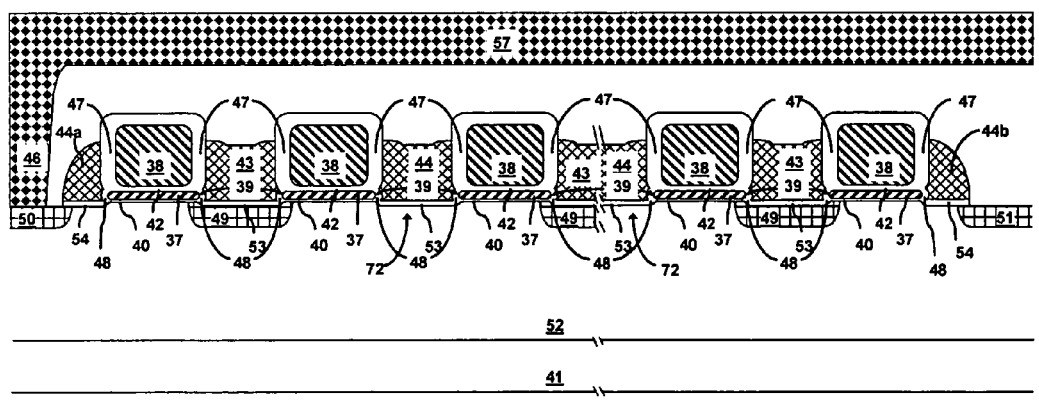

N-type dopants such as $P^{31}$ or $As^{75}$ are implanted into P-well 52 to form the bit line diffusion 50 and common source diffusion 51, as illustrated in FIG. 4G, with the portions 72 of the P-well 52 beneath select gates 44 being used as the channels for those gates.

Thereafter, a glass material such as phosphosilicate glass (PSG) or borophos-phosilicate glass (BPSG) is deposited across the entire wafer, then etched to form wells for bit line contacts 46. Finally, a metal layer is deposited over the glass and patterned to form bit lines 57 and bit line contacts 46.

Figure 5A:
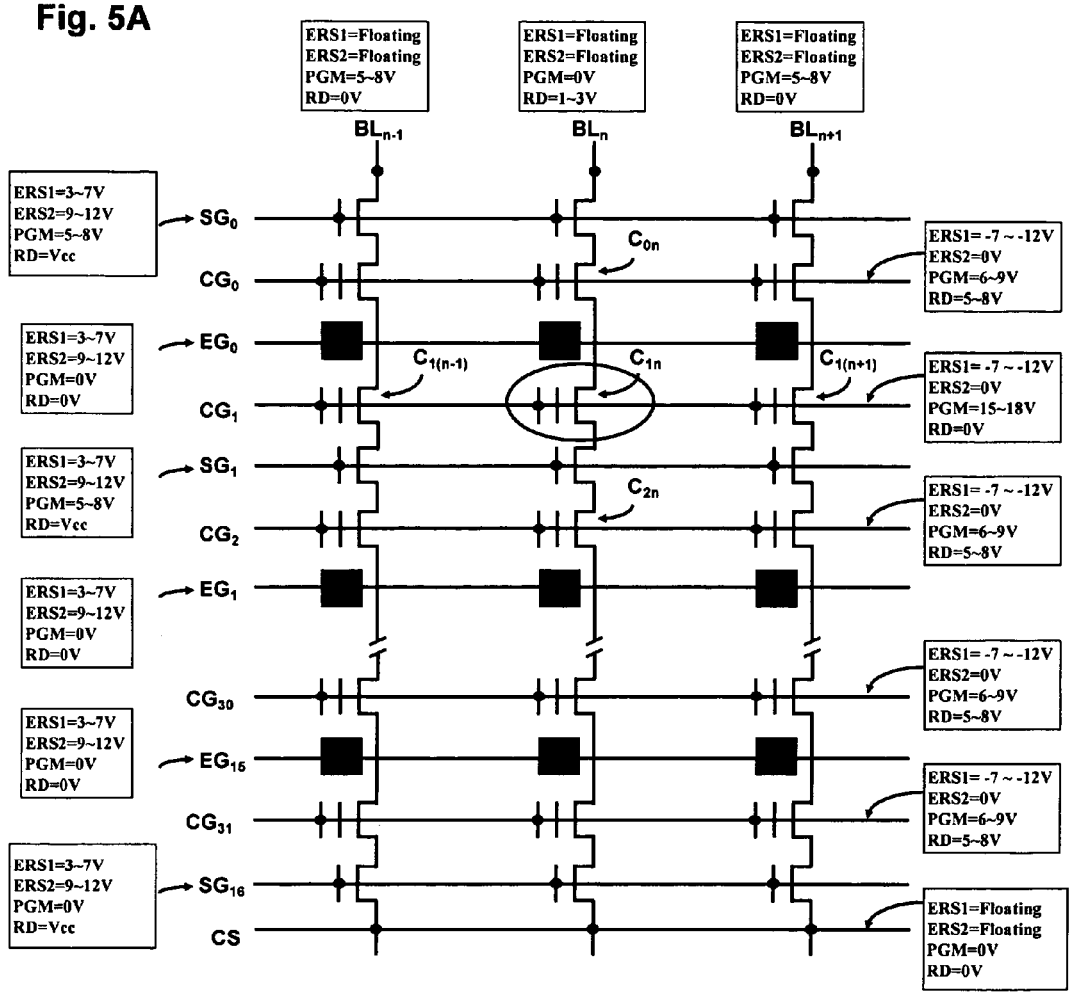
FIGS. 5A–5D are circuit diagrams of a small memory array as in one embodiment of FIG. 2, showing exemplary bias conditions for erase, program and read operations.
Figure 5B:
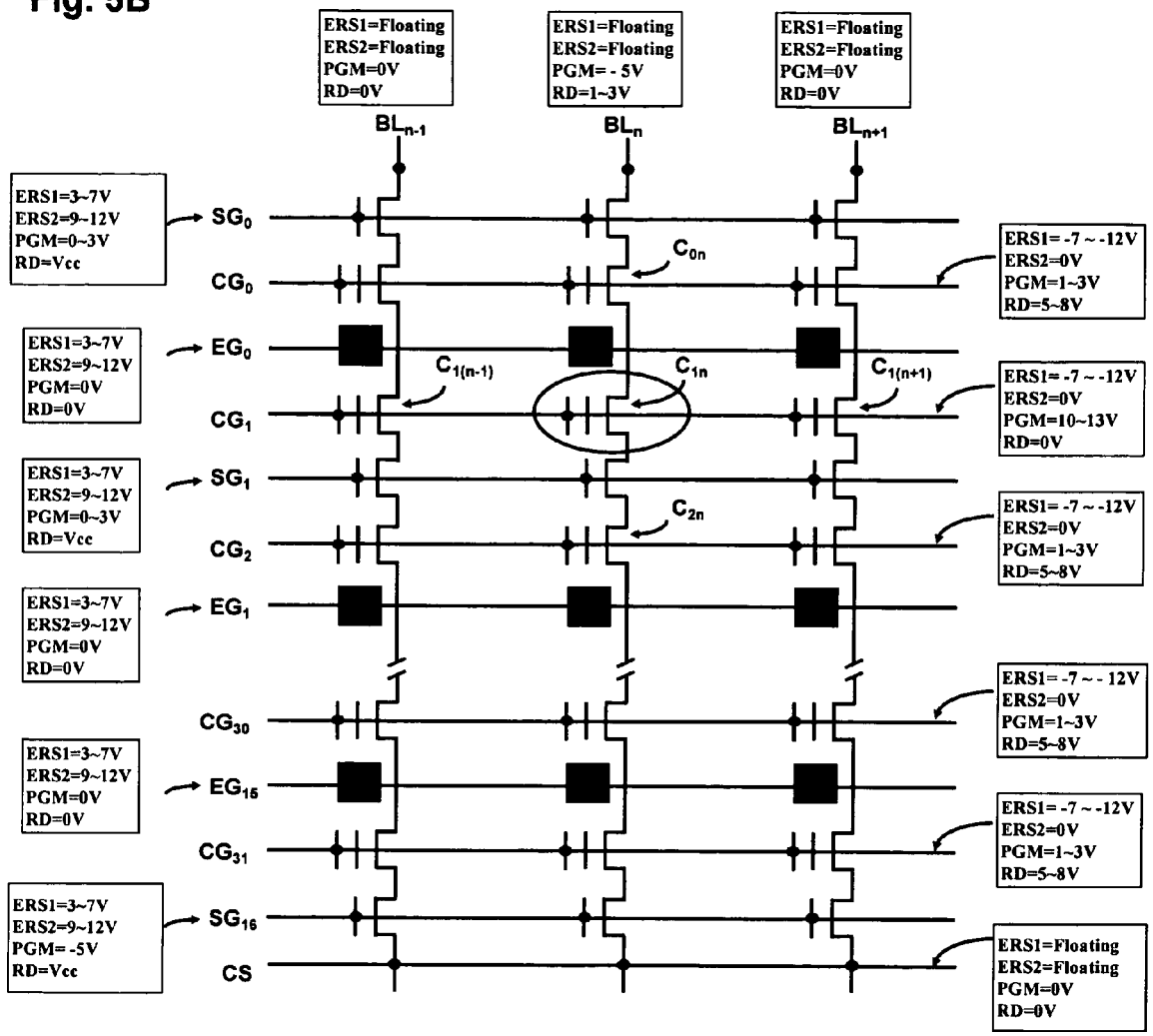
Figure 5C:
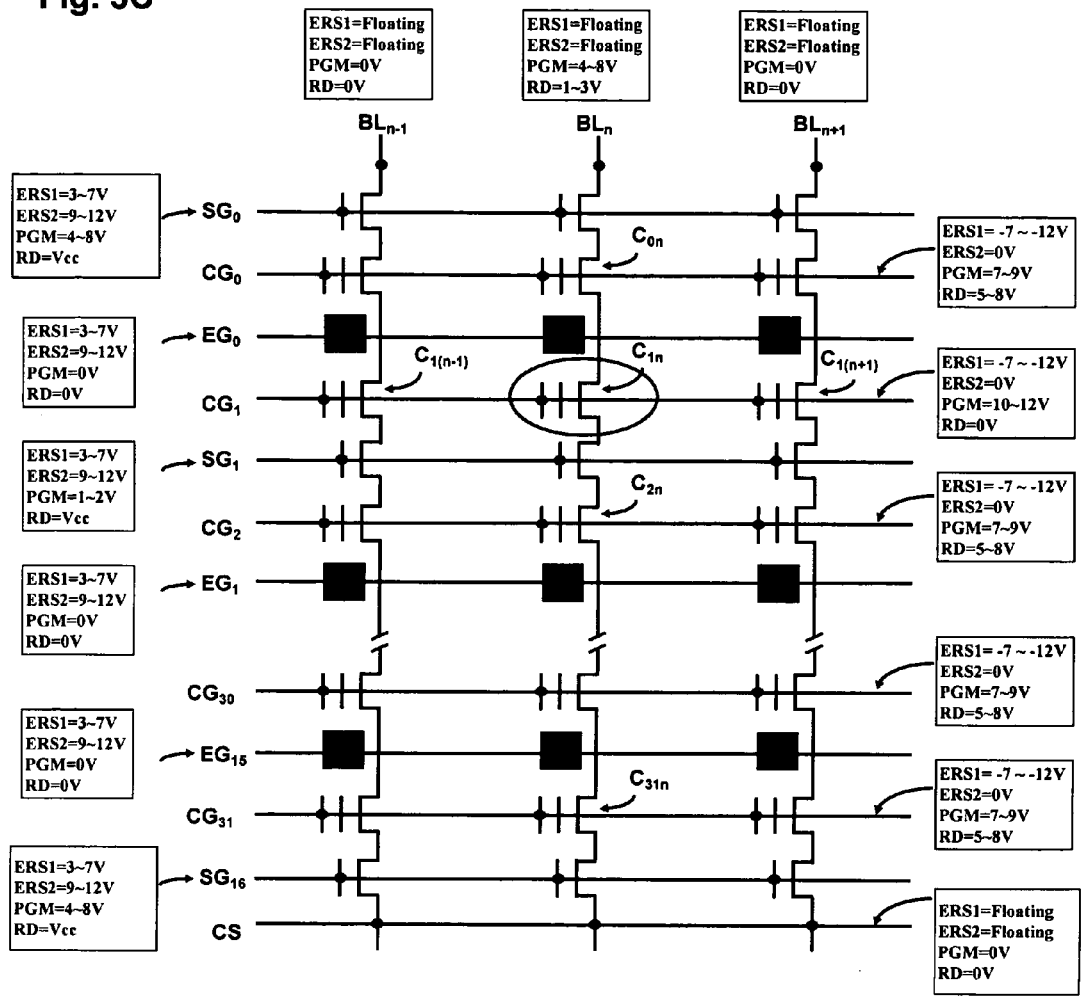
Figure 5D:
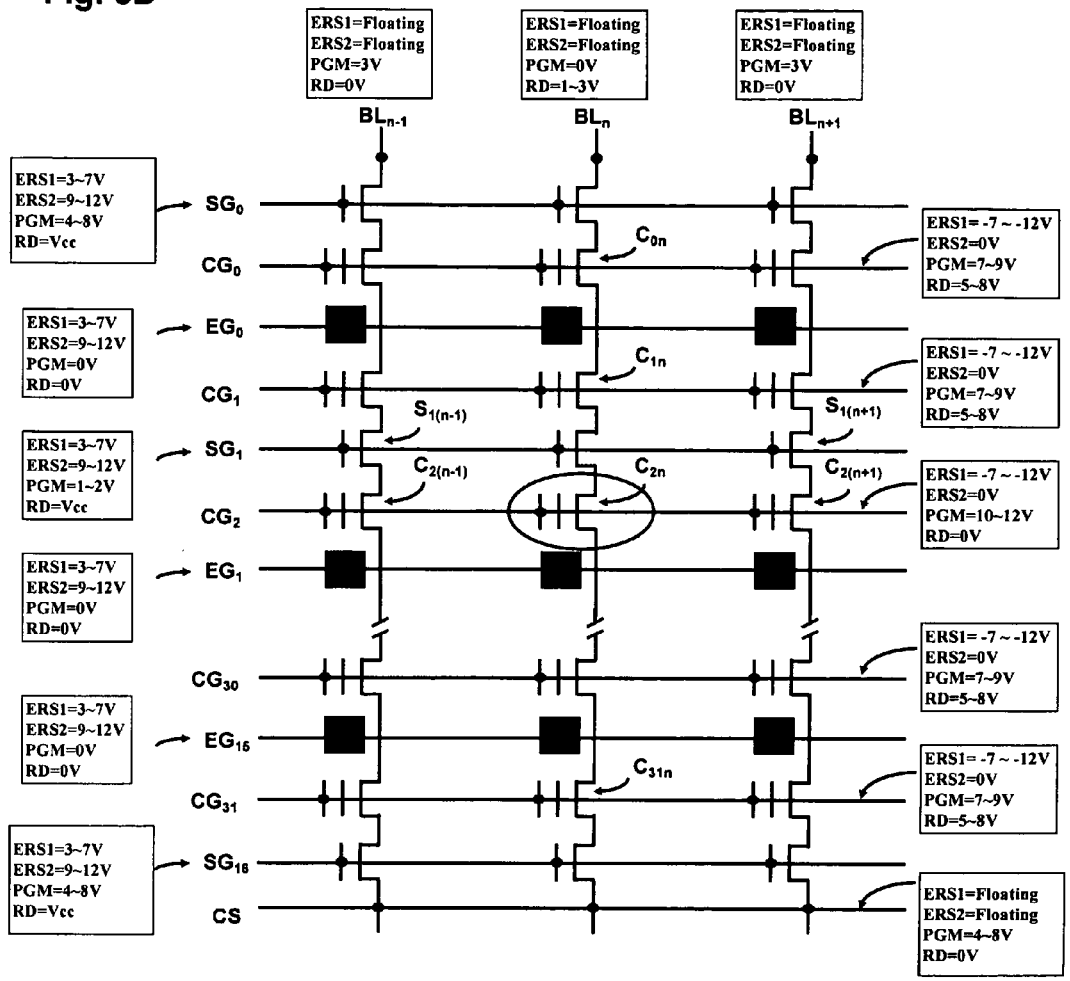

Operation and use of the memory cell array can be described with reference to FIGS. 5A–5D where exemplary bias voltages for erase (ERS), program (PGM) and read (RD) operations are shown next to the terminals of the array. In the examples of FIGS. 5A–5C, the selected memory cell is $C_{1n}$ which is located at the intersection of bit line $BL_n$ and control gate $CG_1$. In the example of FIG. 5D, the selected cell is $C_{2n}$ located at the intersection of bit line $BL_n$ and control gate $CG_2$. The selected cells are circled for ease of location. All of the other memory cells in the array are unselected during PGM and RD operations.

During an erase operation, electrons are forced to tunnel simultaneously from the floating gates to neighboring erase gates and select gates for all cells in array, leaving positive the floating gates positively charged. When the electric field across the tunnel oxide is more than about $10^7$ V/cm, Fowler-Nordheim tunneling becomes significant, and electrons with sufficient energy can tunnel from the cathode electrode (floating gate) to the anode electrodes (erase gate and select gate).

Erasing can be done using either of two bias conditions. In the first erase mode, the control gates of the memory cells are biased at −7 to −12 volts, the select gates $SG_0$ to $SG_{16}$ and the erase gates $EG_0$–$EG_{15}$ are biased at 3–7 volts, and the bit lines and the common source are floating. In the second mode, the control gates are biased at 0 volts, the select gates $SG_0$ to $SG_{16}$ and erase gates $EG_0$–$EG_{15}$ are biased at 9–12 volts, the P-well 52 is biased at 0 volt, and the bit lines and the common source are floating.

With these bias conditions, most of the voltage difference between the control gates and the select gates or erase gates appears across the tunnel oxides surrounding the side walls of floating gates. That triggers Fowler-Nordheim tunneling, with electrons tunneling from the floating gates to adjacent select gates and erase gates for all cells in array. As the floating gates become more positively charged, the threshold voltages of the memory cells, which are preferably in the range of −2 to −5 volts, become lower. This results in an inversion layer in the channel under the floating gate when the control gate is biased at 0 volts. Therefore, the memory cell goes into the conductive state (logic "1") after the erase operation. In an unselected array, the control gates and the erase gates are biased at 0 volts, andl there is no Fowler-Nordheim tunneling during the erase operation.

In the program mode shown in FIG. 5A, the control gate $CG_1$ of the selected memory cell $C_{1n}$ is biased to a level of 15–18 volts; 5–8 volts is applied to the select gates $SG_0$ to $SG_{15}$; 0 volts is applied to the erase gates $EG_0$–$EG_{15}$ and to select gate $SG_{16}$; bit line $BL_n$ is maintained at 0 volts; and the common source CS is biased at 0 volts. With these bias conditions, most of the applied voltage appears across the gate oxide beneath the floating gate, which results in Fowler-Nordheim tunneling, with electrons migrating from the channel region to the floating gate. At the end of the program operation, the floating gate is negatively charged, and the threshold voltage of the memory cell, which preferably is in the range of 1–3 volts, becomes higher. Therefore, the memory cell is turned off when the control gate is biased at 0 volt during a read operation. Following a program operation, the memory cell goes into a non-conductive state (logic "0").

In the unselected memory cells $C_{1(n−1)}$ and $C_{1(n+1)}$ that share the same control gate $CG_1$ with the selected cell $C_{1n}$, the bit lines ($BL_{n−1}$ and $BL_{n+1}$) are biased at 5–8 volts, and the control gate is biased at 15–18 volts. This results in negligible Fowler Nordheim tunneling in those cells, and the floating gate charges remain unchanged. In the other unselected memory cells $C_{0n}$ and $C_{2n}$, the bit line $BL_n$ is maintained at 0 volts, and 6–9 volts is applied to the control gates ($CG_0$ and $CG_2$). This also minimizes Fowler-Nordheim tunneling, and the charges on the floating gates in those cells do not change either.

Another set of bias conditions for the program mode is illustrated in FIG. 5B. In this example, the selected memory cell $C_{1n}$ is biased with 10–13 volts on control gate $CG_1$, 0–3 volts is applied to select gates $SG_0$ to $SG_{15}$; 0 or −5 volts is applied to erase gates $EG_0$–$EG_{15}$; −5 volts is applied to select gate $SG_{16}$, bit line $BL_n$ and P-well 52; and the common source CS is biased at 0 volts. With the cell biased in this manner, most of the applied voltage appears across the gate oxide beneath the floating gate. That results in Fowler-Nordheim tunneling, with electrons migrating from the channel region to the floating gate.

FIG. 5C illustrates a set of bias conditions for the program mode with hot electron injection. The bias conditions are for selected memory cells on control gates with odd index numbers, e.g. $CG_1$, $CG_3$, $CG_5$. For selected cell $C_{1n}$ in FIG. 5C, 10–12 volts is applied to control gate $CG_1$; 4–8 volts is applied to select gates $SG_0$ and $SG_2$–$SG_{16}$; 0 volts is applied to erase gates $EG_0$–$EG_{15}$; 4–8 volts is applied to selected bit line $BL_n$; 7–9 volts is applied to the control gates of other memory cells in the same bit line direction as the selected cell (e.g. $C_{0n}$, $C_{2n}$, and $C_{31n}$); and the unselected bit lines (e.g. $BL_{n−1}$ and $BL_{n+1}$) and common source CS are maintained at 0 volts. The voltage applied to the select gate ($SG_1$ in this example) just adjacent to the selected cell ($C_{1n}$ in this example) can be biased at the range of 1–2 volts. With these bias conditions, the cells and the select transistors are turned on.

Most of the voltage between the common source CS and the bit line $BL_n$ appears across the mid-channel region between select gate $SG_1$ and the floating gate of the selected cell $C_{1n}$, resulting in a high lateral electric filed in that region. In addition, since the floating gate is coupled to a high voltage from bit line $BL_n$ and control gate $CG_1$, a strong vertical electric field is established near the split point of the select gate and the floating gate. When electrons flow from the common source to bit line during program operation, some of the channel electrons are accelerated by lateral electric field, and some of the hot electrons are "hot" enough to exceed the energy barrier height between the channel and oxide (about 3.1 eV), and they will be injected into and collected on the floating gate due to the vertical field in the floating gate oxide. The injection point is near the split point of select gate and floating gate.

At the end of the program operation, the floating gate is negatively charged, and the threshold voltage of the memory cell, which is preferably on the range of 1–3 volts, becomes higher. Thus, the memory cell is turned off when the control gate is biased at 0 volts during a read operation. Following a program operation, the memory cell goes into a non-conductive state (logic "0").

In the unselected memory cells $C_{1(n-1)}$ and $C_{1(n+1)}$ which share the same control gate with the selected cell $C_{1n}$, the bit lines ($BL_{n-1}$ and $BL_{n+1}$) are biased at 0 volts; the select gate $SG_1$ is at 1–2 volts; and the control gate $CG_1$ is at 10–12 volts. The lateral voltage drop between the bit line and the common source is 0 volts, and there is no mid-channel hot carrier injection in cells $C_{1(n-1)}$ and $C_{1(n+1)}$. There is no hot electron injection in unselected memory cells such as $C_{0n}$, $C_{2n}$ in the selected bit line because electrons flow from neighboring erase gate channels (under $EG_0$ and $EG_1$) to the cell channels. Cell $C_{31n}$ is biased with 4–8 volts on both bit line $BL_n$ and select gate $SG_{16}$, and 7–9 volts is applied to control gate $CG_{31}$, which minimizes the mid-channel hot carrier injection, and the floating gate charges are unchanged.

In the read mode, the control gate $CG_1$ of the selected memory cell $C_{1n}$ and the common source CS are biased to 0 volts; 1–3 volts is applied to bit line $BL_n$; and Vcc and 0 volt are applied to the select gates ($SG_0$–$SG_{16}$) and erase gates ($EG_0$–$EG_{15}$), respectively. The unselected memory cells in the bit line direction, e.g. $C_{0n}$ and $C_{2n}$, are turned on by applying 5–8 volts to their control gates. When the memory cell is erased, the read operation shows a conductive state because the channel of selected cell is turned on. This is also the case in the other cells and the select transistors in the same bit line direction. Thus, a logic "1" is returned by the sense amplifier. When the memory cell is programmed, the read shows a non-conductive state because the channel of the selected cell is turned off, and hence the sense amplifier returns a logic "0". In the unselected memory cells $C_{1(n-1)}$ and $C_{1(n+1)}$, both the bit lines ($BL_n$, and $BL_{n+1}$) and common source CS are biased at 0 volts, and there is no current flow between the bit line and the common source nodes.

FIG. 5D illustrates another set of bias conditions for the program mode utilizing hot electron injection. The bias conditions are for selected memory cell on control gates with even index numbers, e.g. $CG_0$, $CG_2$, $CG_4$. The main difference between the bias conditions of this figure and FIG. 5C is that the bit line voltage and common source voltage are swapped in the program mode. For selected cell $C_{2n}$ in FIG. 5D, 10–12 volts is applied to control gate $CG_2$; 4–8 volts is applied to select gates $SG_0$ and $SG_2$–$SG_{16}$; 0 volts is applied to erase gates $EG_0$–$EG_{15}$ and selected bit line $BL_n$; 4–8 volts is applied to common source CS; 7–9 volts is applied to the control gates of other memory cells in the same bit line direction as the selected cell (e.g. $C_{0n}$, $C_{1n}$, and $C_{31n}$); and the unselected bit lines (e.g. $BL_{n-1}$ and $BL_{n+1}$) are biased at 3 volts. With these conditions, the cells and the select transistors are turned on, and the voltage applied to the select gate adjacent to the selected cell ($SG_1$ in this example) can be biased in the range of 1–2 volts.

Most of the voltage between the common source CS and the bit line $BL_n$ appears across the mid-channel region between select gate $SG_1$ and the floating gate of the selected cell $C_{2n}$, resulting in a high lateral electric filed in that region. In addition, since the floating gate is coupled to a high voltage from bit line $BL_n$ and control gate $CG_2$, a strong vertical electric field is established near the split point of select gate and floating gate. When electrons flow from the bit line to common source during programming, some of the channel electrons are accelerated by lateral electric field, and some of the hot electrons are "hot" enough to exceed the energy barrier height between the channel and oxide (about 3.1 eV), and they will be injected into and collected on floating gate by the vertical field in floating-gate oxide. The injection point is near the split point of select gate and floating gate.

At the end of the program operation, the floating gate is negatively charged, and the threshold voltage of the memory cell, which is preferably in the range of 1–3 volts, becomes higher. Thus, the memory cell is turned off when the control gate is biased at 0 volts during a read operation. Following a program operation, the memory cell goes into a non-conductive state (logic "0").

The bit lines ($BL_{n-1}$ and $BL_{n+1}$) for the unselected memory cells $C_{2(n-1)}$ and $C_{2(n+1)}$ which share the same control gate with the selected cell $C_{2n}$ are biased at 3 volts, the select gate $SG_1$ is at 1–2 volts, and the control gate $CG_2$ is at 10–12 volts. Thus, select transistors $S_{1(n-1)}$ and $S_{1(n+1)}$ are turned off, and there is no mid-channel hot carrier injection in cells $C_{2(n-1)}$ and $C_{2(n+1)}$. In unselected memory cells such as $C_{0n}$, $C_{1n}$ and $C_{31n}$ in the selected bit line, there is no hot carrier injection. In cells $C_{1n}$ and $C_{31n}$, electrons flow from neighboring erase gate channels (under $EG_0$ and $EG_{15}$) to the cell channels, and there is no mid-channel hot electron injection. Cell $C_{0n}$ is biased with 4–8 volts on both common source gate CS and select gate $SG_0$, and 7–9 volts is applied to control gate $CG_0$, which minimizes the mid-channel hot carrier injection, and the floating gate charges are unchanged.

In the read mode, the bias conditions in FIG. 5D are the same as in FIG. 5C. The control gate of the selected memory cell $C_{2n}$ and the source are maintained at 0 volts; 1–3 volts is applied to the bit line; and Vcc and 0 volts are applied to the select gates ($SG_0$–$SG_{16}$) and erase gates ($EG_0$–$EG_{15}$), respectively. The unselected memory cells in the bit line direction, e.g. $C_{0n}$ and $C_{1n}$, are turned on by applying 5–8 volts to their control gates. When the memory cell is erased, the read operation shows a conductive state because the channel of the selected cell is turned on, and that is also the case in the other cells and the select transistors in the same bit line direction. Thus, a logic "1" is returned by the sense amplifier. When the memory cell is programmed, the read shows a non-conductive state because the channel of the selected cell is turned off, and hence the sense amplifier returns a logic "0". In the unselected memory cells $C_{2(n-1)}$ and $C_{2(n+1)}$, both the bit line and common source nodes are biased at 0 volts, and there is no current flow between the bit line and the common source nodes.

Figure 6:
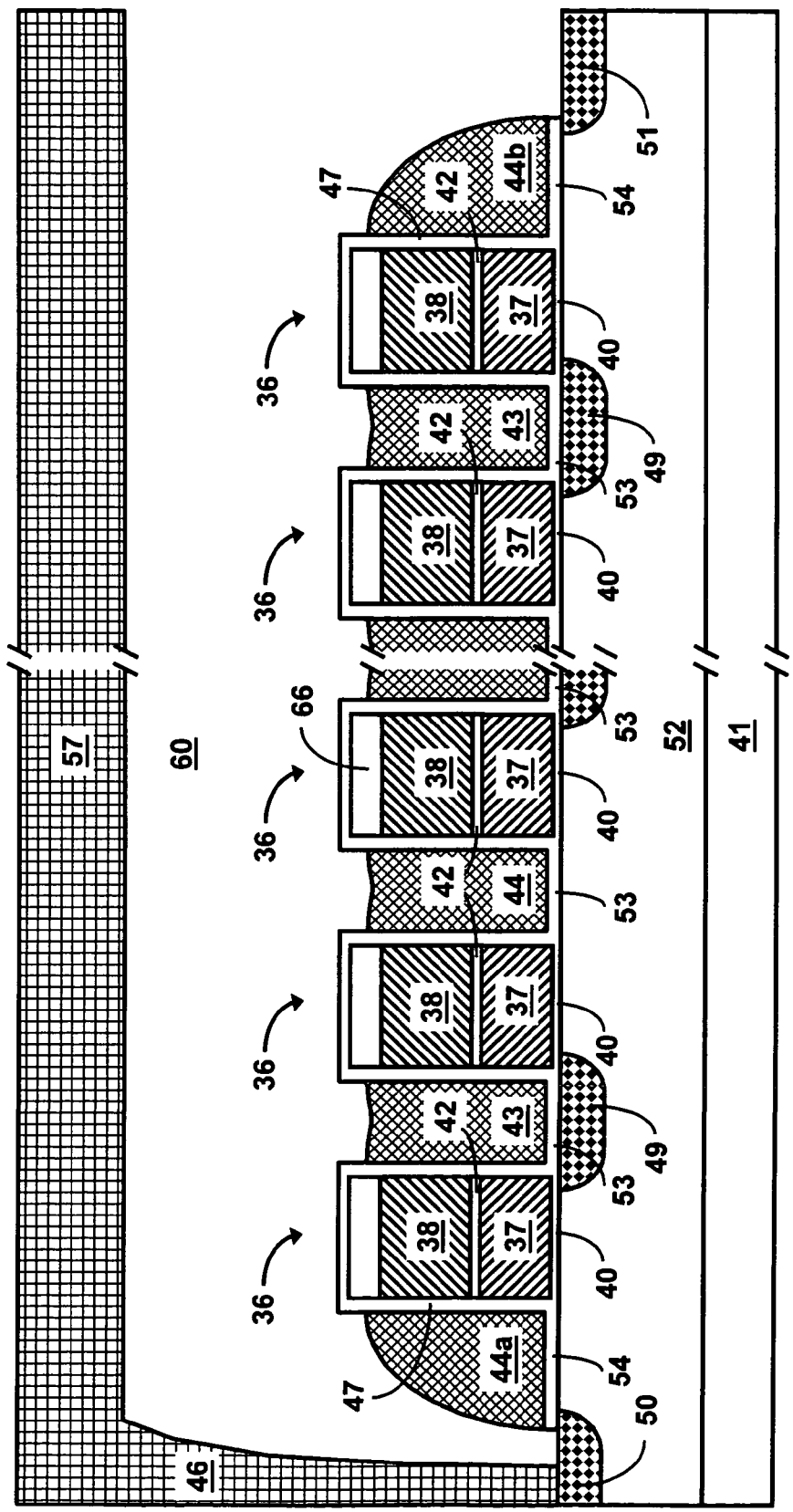
FIG. 6 is a cross-sectional view, taken along line 6—6 in FIG. 7, of another embodiment of a self-aligned split-gate NAND flash memory cell array incorporating the invention.
Figure 7:
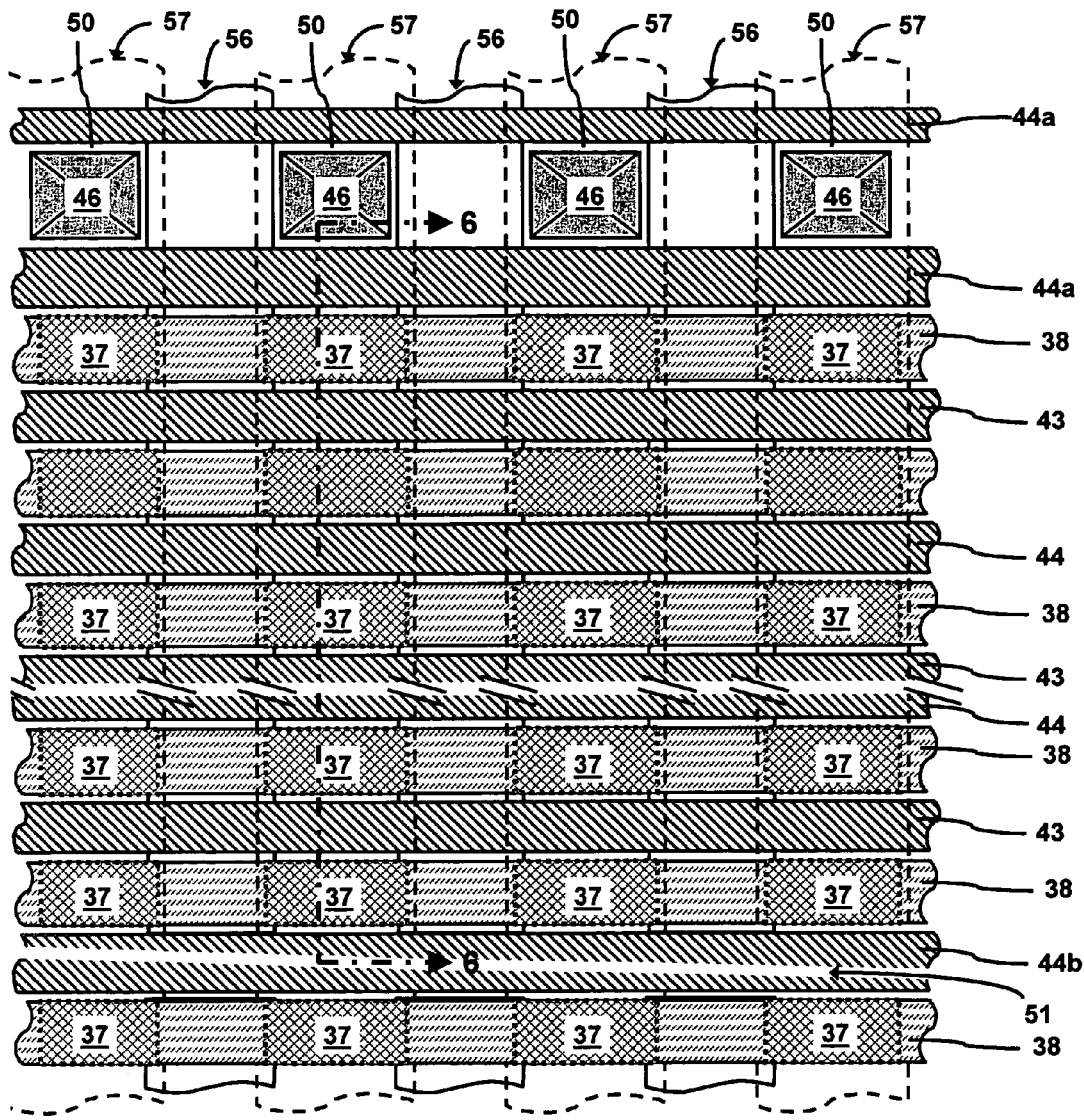
FIG. 7 is a top plan view of the embodiment of FIG. 6.

The embodiment of FIGS. 6–7 is generally similar to the embodiment of FIGS. 2–3, except the floating gates 37 are substantially thicker and do not have relatively sharp rounded edges in this embodiment. Control gates 38 cross over floating gates 37 and the isolation regions 56 between them. Erase gates 43 and select gates 44, 44a, 44b extend in a direction perpendicular to the rows and parallel to the control gates. Bit lines 57 are perpendicular to the erase, select and control gates, and cross over the bit line contact 46, erase gates, select gates, and control gates 38 in each row of the array. The erase path extends from the floating gate through tunnel oxide 40 to the channel region below.

A preferred process of fabricating the embodiment of FIGS. 6–7 is illustrated in FIGS. 8A–8E. In this process, oxide layer 40 is thermally grown to a thickness of about 60 Å to 120 Å on a monocrystalline silicon substrate which, in the embodiment illustrated, is in the form of a P-type substrate 41 in which a P-type well 52 is formed. Alternatively, if desired, an N-type well can be formed in the P-type substrate, in which case the P-type well will be formed in the N-type well.

A conductive layer 62 of polysilicon or amorphous silicon (poly-1) is deposited on the thermal oxide to a thickness on the order of 300 Å to 1500 Å, and an inter-poly dielectric layer 42 is formed on the silicon. The silicon is preferably doped with phosphorus, arsenic or boron to a level on the order of $10^{17}$ to $10^{20}$ per $cm^3$. The doping can be done in-situ during deposition of the silicon or by ion implantation either directly into the silicon or through the dielectric 42 above it. The inter-poly dielectric can be either a pure oxide or a combination of oxide, nitride and oxide (ONO), and in the embodiment illustrated, it consists of a lower oxide layer having a thickness on the order of 30 Å–100 Å, a central nitride layer having a thickness on the order of 60 Å–200 Å, and an upper oxide layer having a thickness on the order of 30 Å–100 Å.

A second layer 63 of polysilicon (poly-2) is deposited on dielectric film 42. This layer has a thickness on the order of 1500 Å–3500 Å, and is doped with phosphorus, arsenic or boron to a level on the order of $10^{20}$ to $10^{21}$ per $cm^3$. A CVD oxide or nitride layer 66 having a thickness on the order of 300 Å–1000 Å is deposited on the poly-2 layer, and is used as a mask to prevent the poly-2 material from etching away during subsequent dry etching steps.

Figure 8A:
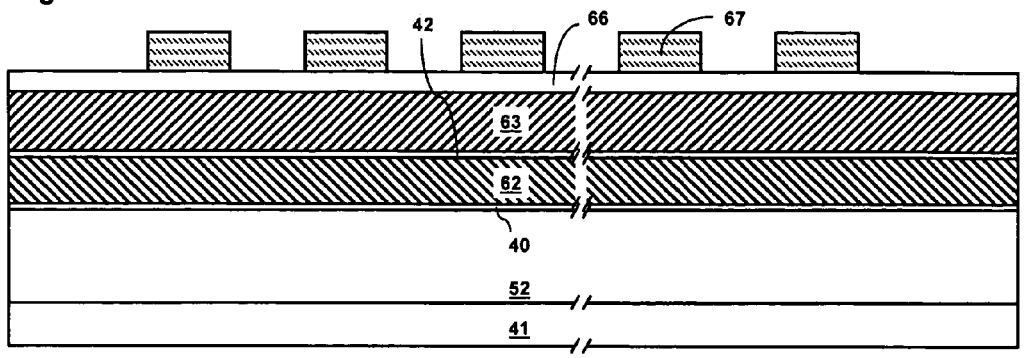
FIGS. 8A–8E are schematic cross-sectional views illustrating the steps in one embodiment of a process for fabricating a NAND flash memory cell array in accordance with the invention.
Figure 8B:
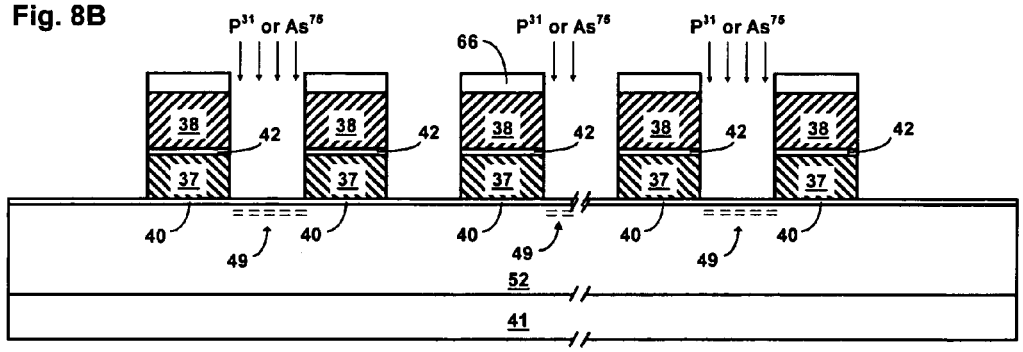

A photolithographic mask 67 is formed over layer 66 to define the control gates, and the unmasked portions of that layer and poly-2 layer 63 are etched away anisotropically, leaving only the portions of the poly-2 which form the control gates 38. The exposed portions of the inter-poly dielectric 42 and the underlying portions of the poly-1 layer 62 are then etched away anisotropically to form the floating gates 37, as illustrated in FIG. 8B. Thereafter, diffusion regions 49 are formed in the substrate between the stack gates by ion implantation using with dopants such as $P^{31}$ or $As^{75}$.

Figure 8C:
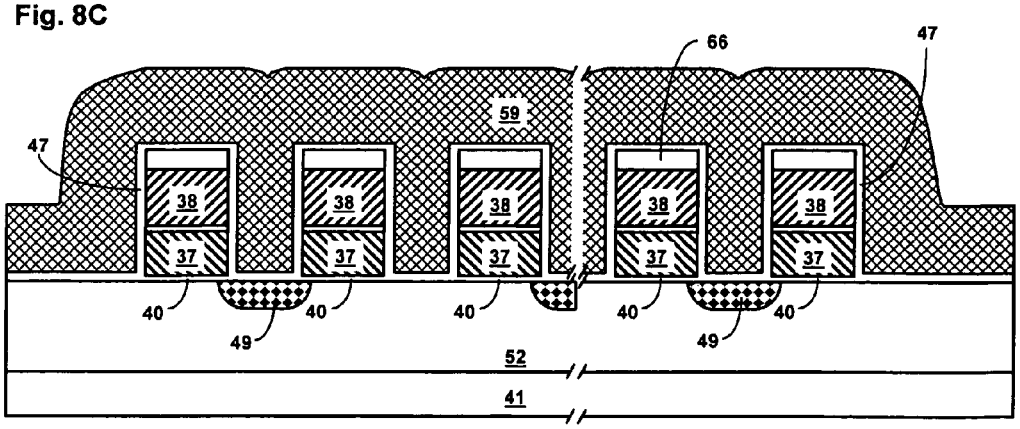

Following ion implantation, a dielectric 47 is formed on the sidewalls of control and floating gates, and a conductive (poly-3) layer 59 is deposited over the entire wafer, as shown in FIG. 8C. The dielectric can be either a pure oxide or a combination of oxide, nitride and oxide (ONO), and in the embodiment illustrated, it consists of a lower oxide layer having a thickness on the order of 30 Å–100 Å, a central nitride layer having a thickness on the order of 60 Å–300 Å, and an upper oxide layer having a thickness on the order of 30 Å–100 Å. The poly-3 layer is typically doped polysilicon or polycide, and is deposited to a thickness on the order of 1500 Å–3000 Å.

Figure 8D:
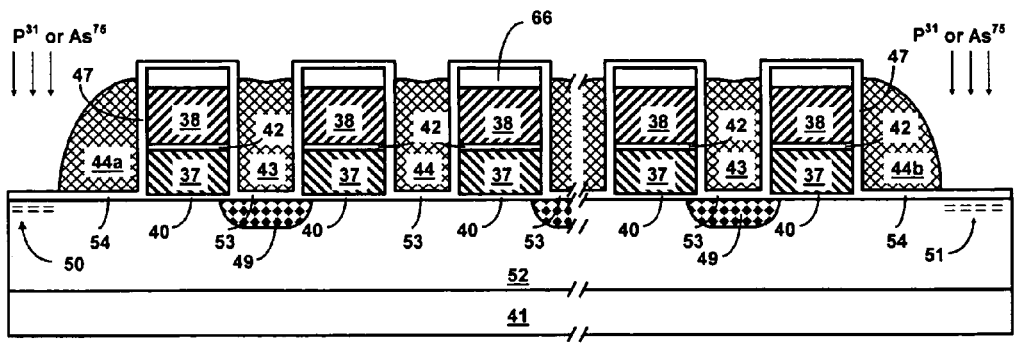

The poly-3 layer is then etched anisotropically to form erase gates 43 and select gates 44, 44a, 44b, as illustrated in FIG. 8D. Being formed in this manner, the erase and select gates are self-aligned and parallel to the control gates. N-type dopants such as $P^{31}$ or $As^{75}$ are implanted into P-well 52 to form the bit line diffusion 50 and common source diffusion 51.

Figure 8E:
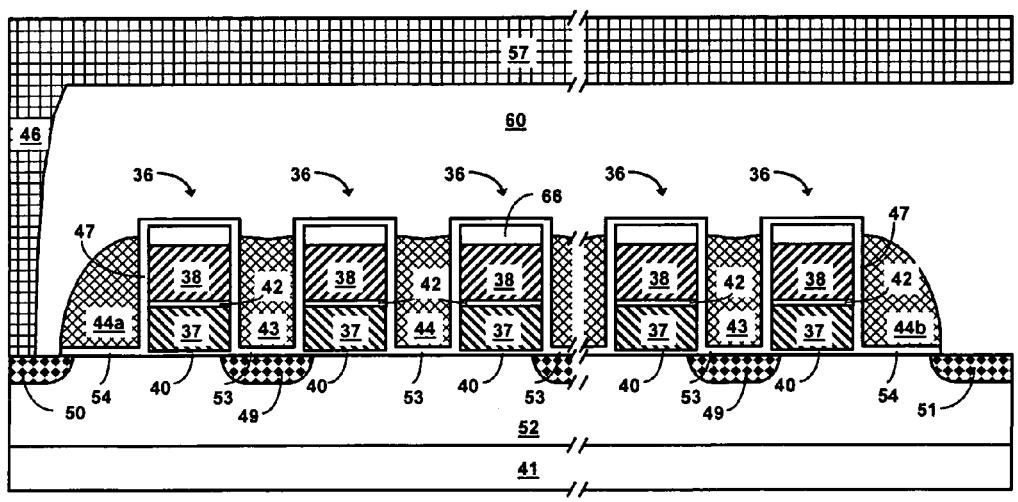

Thereafter, a glass material 60 such as phosphosilicate glass (PSG) or borophosphosilicate glass (BPSG) is deposited across the entire wafer, then etched to form openings for bit line contacts 46, as shown in FIG. 8E. Finally, a metal layer is deposited over the glass and patterned to form bit lines 57 and bit line contacts 46.

Figure 9A:
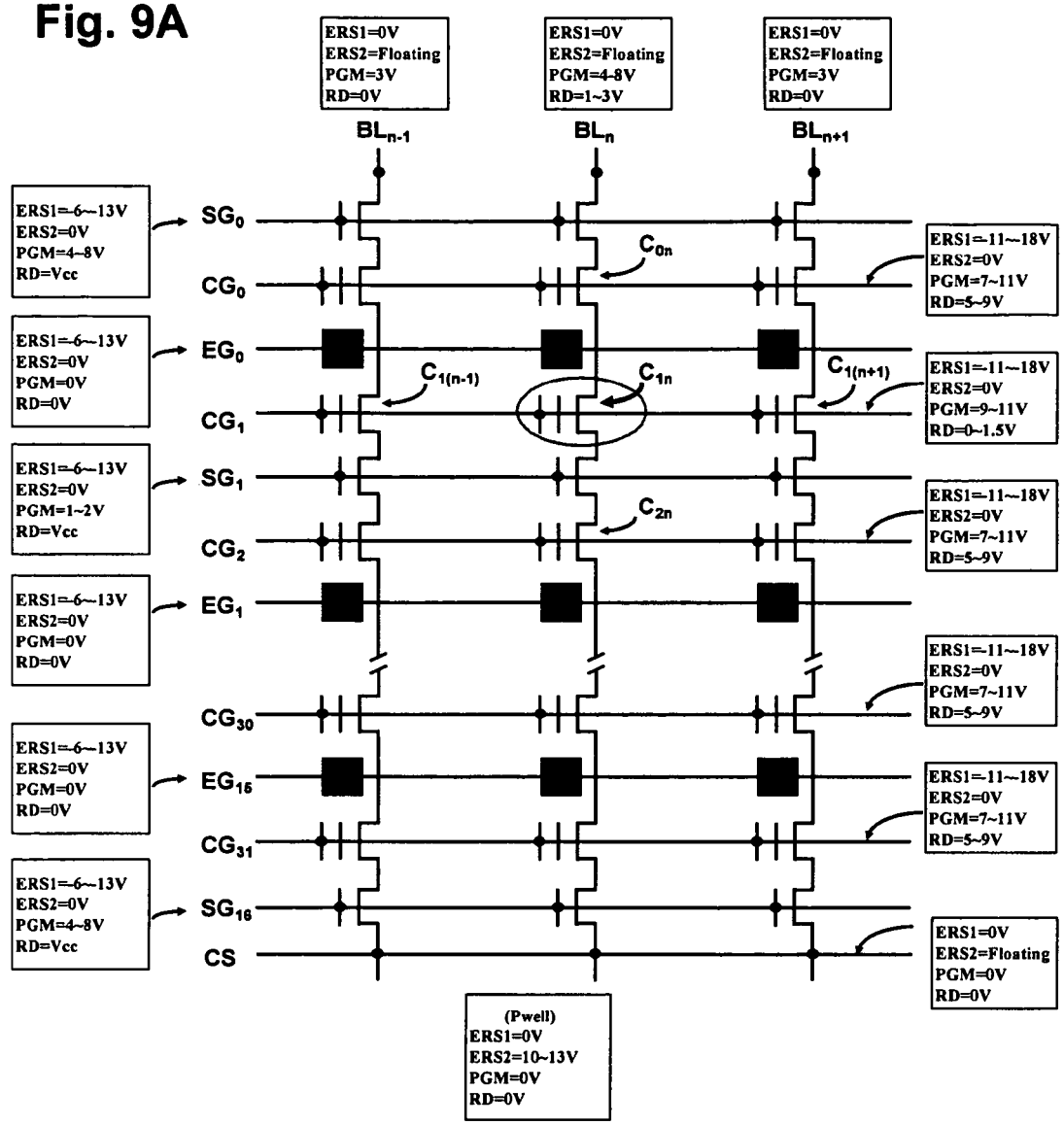
FIGS. 9A–9B are circuit diagrams of a small memory array as in the embodiment of FIG. 6, showing exemplary bias conditions for erase, program and read operations.
Figure 9B:
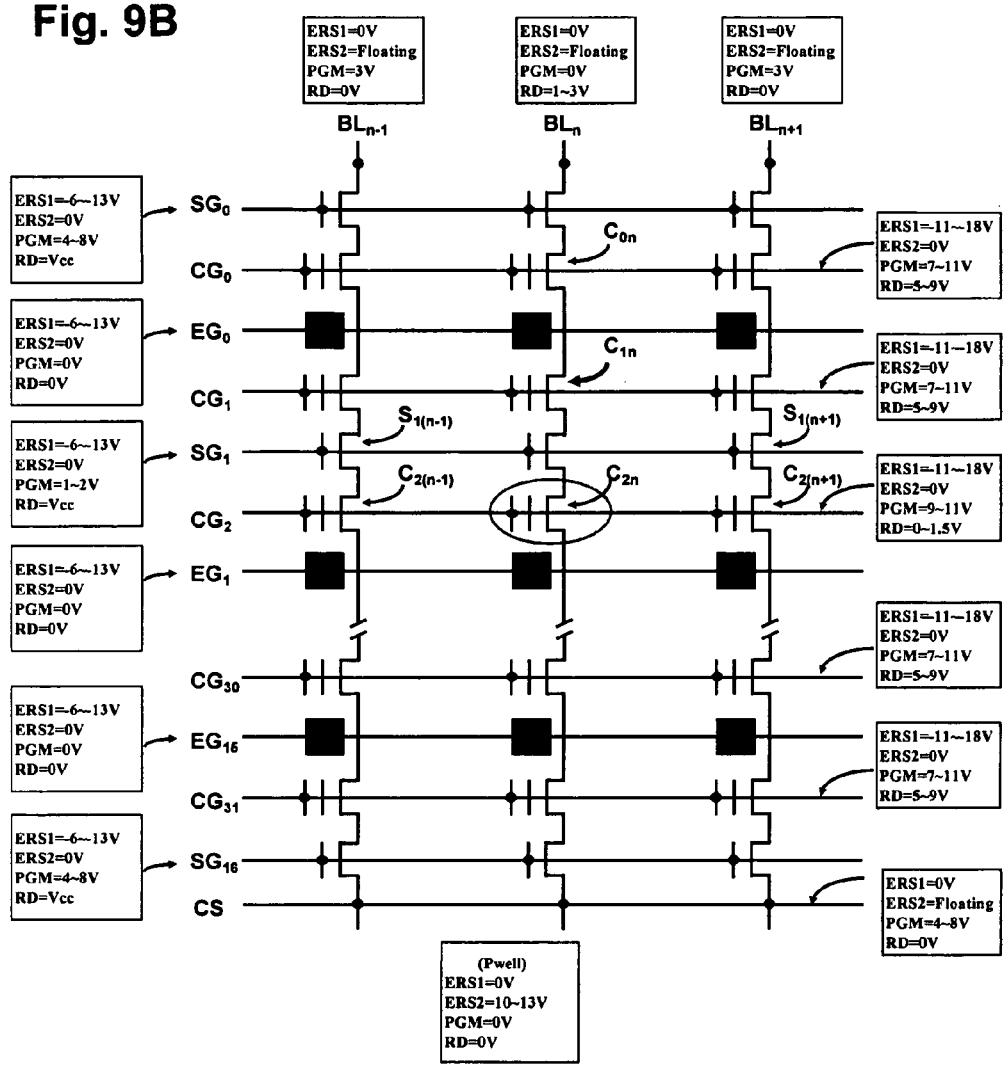

Operation of the embodiment of FIGS. 6–7 is generally similar to that of the embodiment of FIGS. 2–3, and exemplary bias voltages for erase (ERS), program (PGM) and read (RD) operations are shown next to the terminals of the array in FIGS. 9A–9B. In this example, memory cell $C_{1n}$ is once again selected. This cell is located at the intersection of control gate $CG_1$ and bit line $BL_n$, and is encircled on the drawing for ease of location. All of the other memory cells in the array are unselected.

During an erase operation, electrons are forced to tunnel from the floating gate to the channel region beneath it, leaving positive ions in the floating gate. When the electric field across the tunnel oxide is more than 10 mV/cm, Fowler-Nordheim tunneling becomes significant, and electrons with sufficient energy can tunnel from the floating gate to the channel region.

With the control gate, erase gate and select gate surrounding the floating gate or cathode electrode, high-voltage coupling from the control gate, erase gate and select gate to the floating gate is once again substantially enhanced, and the voltage required for Fowler-Nordheim tunneling is reduced significantly. The enhanced coupling also makes it possible to use a thicker tunnel oxide while still maintaining sufficient electron tunneling.

Erasing can be done using either of two bias conditions. In the first erase mode (ERS1), the control gate is biased at a level on the order of –11 to –18 volts, the select gates $SG_0$ to $SG_{16}$ and erase gates $EG_0$–$EG_{15}$ are biased at –6 to –13 volts, and the bit line, common source and P-well are biased at 0 volts. In the second erase mode (ERS2), the control, erase and select gates are biased at 0 volts, the bit line and common source are floating, and the P-well is biased at 10 to 13 volts.

With these bias conditions, most of the voltage applied between the control gate and the select gates appears across the tunnel oxide under the floating gate. That triggers Fowler-Nordheim tunneling, with electrons tunneling from the floating gate to the underneath channel region. As the floating gate becomes more positively charged, the threshold voltage of the memory cell, which is preferably on the order of –2 to –5 volts in this embodiment, becomes lower. That results in an inversion layer in the channel under the floating gate when the control gate is biased at 0 volts. Therefore, the memory cell goes into the conductive state (logic "1") after the erase operation.

In the unselected memory cells, the control gates, erase gates and select gates are biased at 0 volts, so there is no Fowler-Nordheim tunneling in them during the erase operation.

During a programming operation for selected memory cells on control gates with odd index numbers, e.g. $CG_1$, $CG_3$, $CG_5$, the control gate of the selected memory cell $C_{1n}$ is biased to a level of 9–11 volts, 4–8 volts is applied to select gates $SG_0$ and $SG_2$–$SG_{16}$, 0 volts is applied to erase gates $EG_0$–$EG_{15}$, 7–11 volts is applied to the control gates of the other memory cells in the same bit line direction as the selected cell (e.g. $C_{0n}$ and $C_{2n}$), the common source and P-well are held at 0 volts, and 4–8 volts is applied to the bit line. The cells and the select transistors are turned on by applying 7–11 volts to the control gates and 4–8 volts to the select gates. The voltage applied to the select gate just before the selected cell ($SG_1$ and $C_{1n}$ in this example) can be on the low side, preferably on the order of 1–2 volts.

With these bias conditions, most of the voltage between the common source and the bit line appears across the mid-channel region between select gate $SG_1$ and the floating gate of the selected cell $C_{1n}$, resulting in a high electric field in that region. In addition, since the floating gate is coupled to a high voltage from the common source node (i.e., control gate $CG_1$ and select gate $SG_2$), a strong vertical electric field is established across the oxide between the mid-channel region and the floating gate. When electrons flow from the bit line to the common source during the program operation, they are accelerated by the electric field across the mid-channel region, and some of them become heated. Some of the hot electrons get accelerated by the vertical field, which causes them to overcome the energy barrier of the oxide (about 3.1 eV) and inject into the floating gate.

At the end of the program operation, the floating gate is negatively charged, and the threshold voltage of the memory cell, which preferably is on the order of 2–4 volts, becomes higher. Thus, the memory cell is turned off when the control gate is biased at 0 volts during a read operation. Following a program operation, the memory cell goes into a non-conductive state (logic "0").

The bit line for the unselected memory cells $C_{2(n-1)}$ and $C_{2(n+1)}$ which share the same control gate with the selected cell $C_{1n}$ is biased at 3 volts, the select gate $SG_1$ is at 1–2 volts, and the control gate is at 9–11 volts. Thus, select transistors $S_{1(n-1)}$ and $S_{1(n+1)}$ are turned off, and there is no mid-channel hot carrier injection in cells $C_{1(n-1)}$ and $C_{1(n+1)}$. In unselected memory cells such as $C_{0n}$, $C_{2n}$ and $C_{31n}$ in the selected bit line, there is no hot carrier injection. In cells $C_{0n}$ and $C_{2n}$, electrons flow from neighboring erase gate channels (under $EG_0$ and $EG_1$) to the cell channels, and there is no mid-channel hot electron injection. Cell $C_{31n}$ is biased with 4–8 volts to both the bit line $BL_n$ and select gate $SG_{16}$, and 7–9 volts to the control gates $CG_{31}$, which minimizes the mid-channel hot carrier injection, and the floating gate charges are unchanged.

In the read mode, the control gate of the selected memory cell $C_{1n}$ is biased at 0–1.5 volts, the common source is biased to 0 volts, 1–3 volts is applied to the bit line, Vcc is applied to the select gates $SG_0$–$SG_{16}$, and 0 volts is applied to the erase gates $EG_0$–$EG_{15}$. The unselected memory cells in the bit line direction, e.g. $C_{0n}$ and $C_{2n}$, are turned on by applying 5–9 volts to their control gates. When the memory cell is erased, the read shows a conductive state because the channel of selected cell is turned on, and the other cells and the select transistors in the same bit line direction also turned on. Thus, a logic "1" is returned by the sense amplifier. When the memory cell is programmed, the read shows a non-conductive state because the channel of the selected cell is turned off, and hence the sense amplifier returns logic "0". In the unselected memory cells $C_{1(n-1)}$ and $C_{1(n+1)}$, both the bit line and common source nodes are biased at 0 volts, and there is no current flow between the bit line and the common source nodes.

FIG. 9B illustrates the bias conditions for selected memory cell on control gates with even index numbers, e.g. $CG_0$, $CG_2$, $CG_4$. The main difference in the bias conditions shown in FIGS. 9A and 9B is that the bit line voltage and common source voltage are swapped in program mode. For selected cell $C_{2n}$ in FIG. 9B, 9–11 volts is applied to the control gate $CG_2$; 4–8 volts is applied to select gates $SG_0$ and $SG_2$–$SG_{16}$; 0 volt is applied to erase gates $EG_0$–$EG_{15}$ and selected bit line $BL_n$; 4–8 volts is applied to common source CS; 7–11 volts is applied to the control gates of other memory cells in the same bit line direction as the selected cell (e.g. $C_{0n}$, $C_{1n}$, and $C_{31n}$); and the unselected bit lines (e.g. $BL_{n-1}$ and $BL_{n+1}$) are biased at 3 volts. The cells and the select transistors are turned on these voltages. The voltage applied to the select gate ($SG_1$ in this example) adjacent to the selected cell ($C_{2n}$ in this example) can be biased to about 1–2 volts.

With these bias conditions, most of the voltage between the common source CS and the bit line $BL_n$ appears across the mid-channel region between select gate $SG_1$ and the floating gate of the selected cell $C_{2n}$, resulting in a high lateral electric filed in that region. In addition, since the floating gate is coupled to a high voltage from bit line $BL_n$ and control gate $CG_2$, a strong vertical electric field is established near the split point of select gate and floating gate. When electrons flow from the bit line to common source during programming, some of the channel electrons are accelerated by the lateral electric field, and some of the hot electrons are "hot" enough to surmount energy barrier height for electron between channel and oxide (about 3.1 eV), and they will be injected into and collected on floating gate because of the vertical field in floating-gate oxide. The injection point is near the split point of select gate and floating gate.

At the end of the program operation, the floating gate is negatively charged, and the threshold voltage of the memory cell, which is preferably in the range of 1–3 volts, becomes higher. Thus, the memory cell is turned off when the control gate is biased at 0 volts during a read operation. Following a program operation, the memory cell goes into a non-conductive state (logic "0").

For the unselected memory cells $C_{2(n-1)}$ and $C_{2(n+1)}$ which share the same control gate with the selected cell $C_{2n}$, bit lines ($BL_{n-1}$ and $BL_{n+1}$) are biased at 3 volts; the select gate $SG_1$ is at 1–2 volts; and the control gate $CG_2$ is at 9–11 volts. Thus, select transistors $S_{1(n-1)}$ and $S_{1(n+1)}$ are turned off, and there is no mid-channel hot carrier injection in cells $C_{2(n-1)}$ and $C_{2(n+1)}$. In unselected memory cells such as $C_{0n}$, $C_{1n}$, and $C_{31n}$ in the selected bit line, there is no hot carrier injection. Electrons flow from the erase gate channels adjacent to cells $C_{1n}$ and $C_{31n}$ (under $EG_0$ and $EG_{15}$) to cell channels; and thus there is no mid-channel hot electron injection. Cell $C_{0n}$ is biased with 4–8 volts on both the common source CS and the select gate $SG_0$, and 7–11 volts on the control gates $CG_0$, which minimizes the mid-channel hot carrier injection, and the floating gate charges are unchanged.

In the read mode, the bias conditions shown in FIGS. 9A and 9B are the same. The control gate of the selected memory cell $C_{2n}$ and the source are biased to 0–1.5 volts; 1–3 volts is applied to the bit line; and Vcc and 0 volts are applied to the select gates ($SG_0$–$SG_{16}$) and erase gates ($EG_0$–$EG_{15}$), respectively. The unselected memory cells in the bit line direction, e.g. $C_{0n}$ and $C_{1n}$, are turned on by applying 5–9 volts to their control gates. When the memory cell is erased, the read operation shows a conductive state because the channel of selected cell is turned on. This is also the case for the other cells and the select transistors in the same bit line direction. Thus, a logic "1" is returned by the sense amplifier. When the memory cell is programmed, the read shows a non-conductive state because the channel of the selected cell is turned off, and hence the sense amplifier returns a logic "0". In the unselected memory cells $C_{2(n-1)}$ and $C_{2(n+1)}$, both the bit line and common source nodes are biased at 0 volts, and there is no current flow between the bit line and the common source nodes.

The invention has a number of important features and advantages. It provides a self-aligned split-gate NAND flash memory cell array which has significantly smaller cell size and greater cell density than memory structures heretofore provided. The control and floating gates in each cell are stacked and self-aligned with each other, and the erase gates and select gates are split from but self-aligned with the stacked gates. Resistance of the channel region between bit line diffusion and common source region is reduced significantly by diffusions beneath the erase gates, which permits the length of the structure and the number of cells in each row to be substantially greater than in devices which do not have such diffusions. In addition, the control gates, the select gates and the erase gates surround the floating gates in a manner which provides a relatively large inter-gate capacitance for high-voltage coupling during program and erase operations.

It is apparent from the foregoing that a new and improved self-aligned split-gate NAND flash memory and process of fabrication have been provided. While only certain presently preferred embodiment has been described in detail, as will be apparent to those familiar with the art, certain changes and modifications can be made without departing from the scope of the invention as defined by the following claims.

What is claimed is:

1. A NAND flash memory cell array, comprising: a substrate having an active area, a bit line diffusion and a source region spaced apart from each other toward opposite sides of the active area, a plurality of vertically stacked pairs of floating gates and control gates arranged in a row between the bit line diffusion and the source region, with the control gates being positioned above and aligned with the floating gates, a select gate and an erase gates aligned with and positioned on opposite sides of each of the stacked gates, with select gates at the ends of the row partially overlapping the bit line diffusion and the source region, a diffusion region in the active area beneath each of the erase gates, a bit line above the row, and a bit line contact interconnecting the bit line and the bit line diffusion.

2. The memory cell array of claim 1 wherein the control gates, the select gates and the erase gates surround the floating gates in a manner which provides a relatively large inter-gate capacitance for high-voltage coupling during an erase operation.

3. The memory cell array of claim 1 wherein the control gates, the erase gates and the channel regions beneath the floating gates surround the floating gates in a manner which provides a relatively large capacitance for high-voltage coupling during a program operation.

4. The memory cell array of claim 1 including a relatively thin tunnel oxide between the floating gates and the substrate, and relatively thick dielectrics between the floating gates and the other gates.

5. The memory cell array of claim 4 wherein erase paths extend from the floating gates through the tunnel oxide to channel regions in the active area below, and high voltage is coupled to the floating gates from the control gates, the select gates and the erase gates.

6. The memory cell array of claim 1 wherein program paths extend from off-gate channel regions between the select gates and the floating gates to the floating gates, and high voltage is coupled to the floating gates from the control gates, from the erase gates, and from the channel regions beneath the floating gates.

7. The memory cell array of claim 1 wherein program paths extend from off-gate channel regions between the select gates and the floating gates to the floating gates, and the select gate in a selected cell is biased at a lower voltage than the other select gates in the row to control channel current for efficient hot carrier injection during a program operation.

8. The memory cell array of claim 1 wherein the erase gates are biased at a voltage near ground potential, and the select gates in unselected cells are biased at a relatively high voltage to turn on channels beneath them to form a conduction path between the bit line diffusion and the source region.

9. The memory cell array of claim 1 wherein the bit line diffusion and source region are formed in a P-well, and an erase path is formed by a relatively high negative voltage on the control gates and a relatively low negative voltage on the select and erase gates, with the bit line diffusion and source region, and P-well at 0 volts.

10. The memory cell array of claim 1 wherein the bit line diffusion and source region are formed in a P-well, and an erase path is formed by applying a relatively low positive voltage on the control gates, the select gates and the erase gates with the P-well at a relatively high positive voltage and the bit line and source diffusions floating.

11. The memory cell array of claim 1 wherein a read path is formed by turning on the select transistors and the stacked control and floating gate transistors in unselected cells, with the common source at 0 volts, the bit line diffusion at 1–3 volts, the erase gates at a potential near zero volts, and the control gates for the unselected cells at a relatively high positive voltage, and the control gate of the selected cell is biased at 0–1.5 volts to form a conduction channel under the floating gate for an erase state and a non-conduction channel for a program state.

12. The memory cell array of claim 1 including an erase path which can erase all of the cells in the array simultaneously and a program path which is single cell selectable.

13. A NAND flash memory cell array, comprising: a substrate having an active area, a bit line diffusion and a source region spaced from each other toward opposite sides of the active area, a plurality of control gates and floating gates stacked together and arranged in rows between the bit line diffusion and the source region, select gates and erase gates aligned with and positioned on opposite sides of the stacked gates, with select gates at both ends of each of the rows partially overlapping the bit line diffusion and the source region, diffusion regions in the active area beneath the erase gates, a bit line above each of the rows, and bit line contacts interconnecting the bit lines and the bit line diffusion.

14. The memory cell array of claim 13 wherein the bit line for a row containing a selected cell to be programmed is held at 0 volts, a relatively low positive voltage is applied to the select gate for the selected cell, a relatively high positive voltage is applied to the common source, a relatively high positive voltage is applied to the control gate for the selected cell, a voltage near ground potential is applied to the erase gates, and a relatively high positive voltage is applied to the control gates for the unselected cells.

15. The memory cell array of claim 13 wherein alternate ones of the cells are programmed by applying 0 volts to the bit line diffusion, a relatively positive voltage to the common source region, a relatively low positive voltage to the select gate for a selected cell, and a relatively high positive voltage to the control gate for the selected cell.

16. The memory cell array of claim 13 wherein the bit line for a row containing a selected cell to be programmed is held at a relatively high positive voltage, a relatively low positive voltage is applied to a cell select gate for the selected cell, 0 volts is applied to the common source region, a relatively high positive voltage is applied to the control gate in the selected cell, a relatively high positive voltage is applied to the control gates of unselected cells, a voltage near ground potential is applied to the erase gates, and a relatively high positive voltage is applied to the control gates in the unselected cells.

17. The memory cell array of claim 13 wherein alternate ones of the cells are programmed by applying 0 volts to the common source, a relatively positive voltage to the bit line diffusion, a relatively low positive voltage to the select gate for a selected cell, and a relatively high positive voltage to the control gate for the selected cell.

18. A NAND flash memory cell array, comprising: a substrate having an an active area, a bit line diffusion and a common source diffusion spaced apart from each other in the active area, a plurality of vertically stacked pairs of floating gates and control gates arranged in a row between the bit line and source diffusions, with the floating gates being relatively thin and the control gates being positioned above the floating gates, erase and select gates interposed between and aligned with the stacked gates, with select gates at the ends of the row partially overlying the bit line diffusion and the common source diffusion, relatively thin tunnel oxides between the side walls of the floating gates and adjacent ones of the select and erase gates, a bit line above the row, and a bit line contact interconnecting the bit line and the bit line diffusion.

19. The memory cell array of claim 18 including diffusion regions of N+ material in the active area beneath the erase gates.

20. The memory cell array of claim 18 wherein the control gates are substantially thicker in vertical dimension and narrower in lateral dimension than the floating gates.

21. The memory cell array of claim 18 including a relatively thin dielectric film between each of the floating gates and the substrate, and relatively thick dielectrics between the other gates and the substrate.

22. The memory cell array of claim 18 wherein erase paths extend from the side walls of the floating gates through the tunnel oxides to adjacent ones of the erase and select gates, a relatively negative voltage is applied to the control gates, and a relatively positive voltage is applied to the erase and select gates, with high voltage coupling between the control gates and substrate and the floating gates, and electrons migrating from the floating gates to the select gates and erase gates.

23. The memory cell array of claim 18 including a program path with a gate oxide between each of the floating gates and an underlying channel region in the substrate through which electrons can travel by tunneling to build up a negative charge on the floating gate.

24. The memory cell array of claim 18 wherein a program path is formed between each of the floating gates and an underlying channel region in the substrate by applying a relatively negative voltage to the bit line diffusion and the substrate and a relatively positive voltage to the control gates so that electrons tunnel from the channel region to the floating gate and a negative charge builds up on the floating gate.

25. The memory cell array of claim 18 wherein a program path is formed between bit line diffusion and a channel region in the substrate beneath the stacked gates in a selected cell by applying a relatively negative voltage to the bit line diffusion and substrate, a relatively positive voltage to the select gate for the cell, a relatively positive voltage to the control gate in the cell, and a voltage near ground potential to the erase gate for the cell.

26. The memory cell array of claim 18 including a program path comprising a gate oxide between one the floating gates and an underlying channel region in the substrate through which electrons can travel by hot carrier injection to build up a negative charge on the floating gate.

27. The memory cell array of claim 18 wherein a program path is formed between the floating gate in a selected one of the cells and an underlying channel region in the substrate by applying a voltage near ground potential to the common source diffusion, a relatively positive voltage to the bit line diffusion, a relatively low positive voltage to the select gate adjacent for the selected cell, and a relatively high positive voltage to the control gate in the cell so that electrons travel by hot carrier injection from the channel region to the floating gate and build up a negative charge on the floating gate.

28. The memory cell array of claim 18 wherein alternate ones of the cells are programmed by applying a voltage near zero to the common source diffusion, a relatively positive voltage to the bit line diffusion, a relatively low voltage to the select gate for the selected cell, and a relatively high voltage to the control gate in the cell.

29. The memory cell array of claim 18 wherein a program path is formed between one the floating gates and an underlying channel region in the substrate by applying a voltage near ground potential to the bit line diffusion, a relatively positive voltage to the common source diffusion, a relatively low positive voltage to the select gate for the selected cell, and a relatively high positive voltage to the control gate in the cell so that electrons travel by hot carrier injection from the channel region to the floating gate and build up a negative charge on the floating gate.

30. The memory cell array of claim 18 wherein alternate ones of the stacked are programmed by applying a voltage near zero to the bit line diffusion, a relatively positive voltage to the common source diffusion, a relatively low positive voltage to the select gate for the selected stacked cell, and a relatively high positive voltage to the control gate in the cell.

* * * * *